United States Patent [19]

Bertails

[11] Patent Number: 4,524,425
[45] Date of Patent: Jun. 18, 1985

[54] HIGH-PASS FILTER OF THE FIRST ORDER AND APPLICATION THEREOF TO TELEPHONY

[75] Inventor: Jean C. Bertails, Grenoble, France

[73] Assignee: Societe Pour L'etude et la Fabrication des Circuits Integres Speciaux E.F.C.I.S., Grenoble, France

[21] Appl. No.: 456,848

[22] Filed: Jan. 10, 1983

[30] Foreign Application Priority Data

Jan. 15, 1982 [FR] France ............... 82 00612

[51] Int. Cl.³ ............... G06G 7/00; H03H 17/00; H04B 12/02
[52] U.S. Cl. ............... 364/825; 364/861; 330/107; 333/173
[58] Field of Search ............... 364/825, 824, 861, 862; 330/107, 109; 333/173; 455/307; 179/121 R, 170 C, 170 HF

[56] References Cited

U.S. PATENT DOCUMENTS

| | | | |
|---|---|---|---|
| 4,179,665 | 12/1979 | Gregorian | 330/107 |
| 4,210,872 | 7/1980 | Gregorian | 330/107 |
| 4,405,899 | 9/1983 | Wurzburg | 330/107 |
| 4,455,539 | 6/1984 | Wurzburg | 333/173 |

OTHER PUBLICATIONS

Gregorian et al, "MOS Sampled-data High-pass Filters Using Switched-Capacitor Integrators", Microelectronics Journal, vol. 11, No. 2, Mar.-Apr. 1980, pp. 22-25.

Gregorian et al., "CMOS Switched-Capacitor Filters for a PCM Voice CODEC", *IEEE Journal of Solid-State Circuits,* vol. SC-14, No. 6, Dec. 1979, pp. 970-980.

Haque et al., "A Two Chip PCM Voice CODEC With Filters", *IEEE Journal of Solid-State Circuits,* vol. SC-14, No. 6, Dec. 1979, pp. 961-969.

*Primary Examiner*—Jerry Smith
*Assistant Examiner*—Gary V. Harkcom
*Attorney, Agent, or Firm*—Cushman, Darby & Cushman

[57] ABSTRACT

A sampled first order high pass filter having a configuration that eliminates the output offset voltage normally associated with known filters of this general type. It is constructed according to the diagram of the accompanying figure with two operational amplifiers, four capacitors and eight switches actuated at each period in two separate phases a and b. The filter is particularly useful in digital telephone transmission. The filter is placed just up-stream of an analog-digital converter sampled at the same frequency as the filter and the second amplifier serves as a comparator for conversion outside the phases a and b.

6 Claims, 8 Drawing Figures

HIGH-PASS FILTER OF THE FIRST ORDER AND APPLICATION THEREOF TO TELEPHONY

BACKGROUND OF THE INVENTION

The present invention relates to filters and it will be explained with reference to a particular application which is speech processing for converting it into digital signals before transmission over a telephone line. This very important application shows very well the interest of the filter of the invention but other applications may of course be considered for this filter.

In digital telephone transmission, the speech frequency signals from a microphone undergo filtering so as to retain only signals in a desired frequency band (200 to 3400 Hertz for example) before being applied to an analog-digital converter which operates in a sampled fashion at a frequency for example of 8 kHz (much higher than the speech frequencies transmitted). The analog-digital converter examines then every 125 microseconds the level of the filtered speech signal and converts it into a binary digital value which is fed to the telephone line.

For reasons of ease of integration on very small-sized semiconductor wafers, the filtering is essentially provided by means of switched capacity filters (according to a principle described more especially in the articles of the review IEEE Journal of Solid State Circuits, vol SC-12, no. 6, December 1977, pages 592–608). In these filters, the resistances of the circuits are replaced by capacitors switched at a switching frequency higher than the frequencies to be transmitted through the filter. For example, the switching frequency may be 128 kHz.

The advantage of switched capacity filters is that they allow very low cut-off frequencies to be obtained (e.g. a high-pass filter cutting off at 200 Hz) without requiring components which would take up too much room on a silicon surface in an integrated circuit. In the application under consideration, they allow more especially filters and analog-digital coder to be placed on the same substrate, and a filtering and coding circuit to be formed on the same substrate for transmitting and a decoding and filtering circuit for reception (codec+filter).

FIG. 1 shows a possible filtering and coding arrangement with a first high-pass filter 10, for example of the third order, with a cut-off frequency of about 200 Hz, then a low-pass filter 12, for example of the fifth order with a cut-off frequency of about 3.4 kHz, then an analog-digital converter 14.

Unfortunately, the low-pass filter which is an active filter formed from operational amplifiers, presents at its output a not inconsiderable offset voltage (for example of the order of 200 millivolts) which is interpreted by the converter as a signal level to be coded digitally. This is particularly troublesome because the coding law of the converter is established with high compression for improvement of the dynamic extent of the transmitted signals. Thus, the weak signals are identified with coding levels much closer together than the stronger signals. The variations of the offset voltage at the output shift the overall level of the weak signals and give them an apparent digital value all the more erroneous since the dynamic compression is more pronounced.

One means for eliminating the residual output offset due to the amplifiers would be to insert and RC network with a capacitor 16 in series between the low-pass filter 12 and coder 14 (FIG. 2). But, considering the frequencies to be transmitted, the capacitor 16 must be too large (of the order of 40 nanofarads) for integration thereof on the same substrate as the filter and the coder. It must then be provided externally, with two terminals for access to the integrated circuit, and it is known that the number of external access terminals of an integrated circuit must be reduced as much as possible.

So provision has been proposed (FIG. 3) of a control loop acting on a source 18 for compensating the residual offset, this loop taking as input signal the sign bit of the converter 14 and acting on the compensation source so that on average the sign bit is as often at 0 as at 1; in fact, over an average period of time, the speech signal must present a zero mean value. If a sign bit is more often at 1 than at 0, it is because there is positive residual offset to be compensated for. But the control loop thus formed has a not inconsiderable time constant which affects the response time of the coder. Moreover, it itself requires a filtering capacitor 20, with however a single external access terminal in the integrated circuit (FIG. 3).

To avoid this high capacity and the external access terminal(s), a different solution is proposed here by starting from the idea that the high-pass filter, which could as has been said be of the third order, is broken down into an upstream high-pass filter, for example of the second order, and a high-pass filter of the first order which presents no residual offset voltage and which is placed downstream of the low-pass filter, immediately upstream of the converter.

SUMMARY OF THE INVENTION

More precisely, the invention relates to a sampled filter comprising a high-pass filtering element of the first order, without offset, which, thus placed in front of a coder, eliminates the above-mentioned drawbacks but which may be used in many other applications than the one which has just been set forth.

The high-pass filtering element without offset comprises in accordance with the invention two operational amplifiers each having an inverting input, a non inverting input connected to a fixed potential and an output; the filtering element comprises an input connected through a first capacitor to the inverting input of the first amplifier and an output connected to the output of this amplifier; a first switch is connected between the inverting input and the output of the first amplifier and a second switch is connected between the inverting input and the output of the second amplifier; the inverting input of the first amplifier is connected to a terminal of a second capacitor whose other terminal is connected through a third switch to the output of the second amplifier and through a fourth switch to the output of the first amplifier; the inverting input of the second amplifier is connected to a terminal of a third capicitor and a fourth capacitor, the other terminal of the third capacitor being connected through a fifth and a sixth switch respectively to the output of the second and of the first amplifier, and the other terminal of the fourth capacitor being connected through a seventh and an eighth switch respectively to the output of the second amplifier and to a reference potential; a switching control circuit is provided for ensuring periodic conduction of the different switches according to two separate conducting phases at each period, the uneven rank switches being closed during the first phase and the even rank switches being closed during the second phase.

The switches are preferably formed by MOS (metal oxide semiconductor) switches.

The filter provided for this high-pass filtering element without offset comprises preferably, upstream of the filtering element, a sampler-inhibitor operating at the same frequency as the switches and applying to the input of the filtering element voltage samples taken at the time of the second phase of a sampling period and inhibited at least until the end of the first phase of the following period.

According to a particularly interesting feature of the invention, the filter forms part of a filtering and analog-digital conversion assembly and the high-pass filtering element without offset is placed immediately upstream of a converter of the type comprising a variable threshold comparator in the form of an amplifier, this amplifier being formed by the second operational amplifier of the high-pass filtering element which is used outside the first and second phases properly speaking of each sampling period, at a time when the second switch is open.

BRIEF DESCRIPTION OF THE DRAWINGS

Other features and advantages of the invention will appear from the following detailed description given with reference to the accompanying drawings in which.

DESCRIPTION OF THE PREFERRED EMBODIMENT

Figure 4:
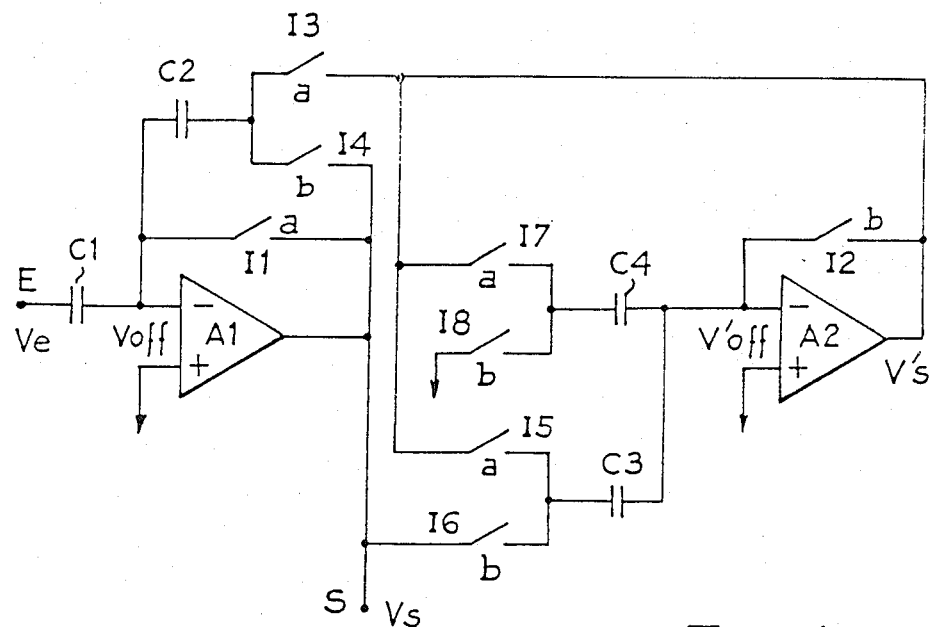
FIG. 4 shows the high-pass filtering element of the first order in accordance with the invention.

The structure of the filtering element of the first order of FIG. 4 has been defined above. The two amplifiers are designated respectively by A1 and A2, the four capacitors by C1, C2, C3, C4 and the eight switches by I1, I2, I3, I4, I5, I6, I7, I8.

The input E of the filtering element receives a voltage Ve which is sampled and inhibited at a frequency which is for example 8 kHz and which is the same as the actuating frequency of the eight switches.

The output S of the filtering element is the output of amplifier A1.

Figure 5:
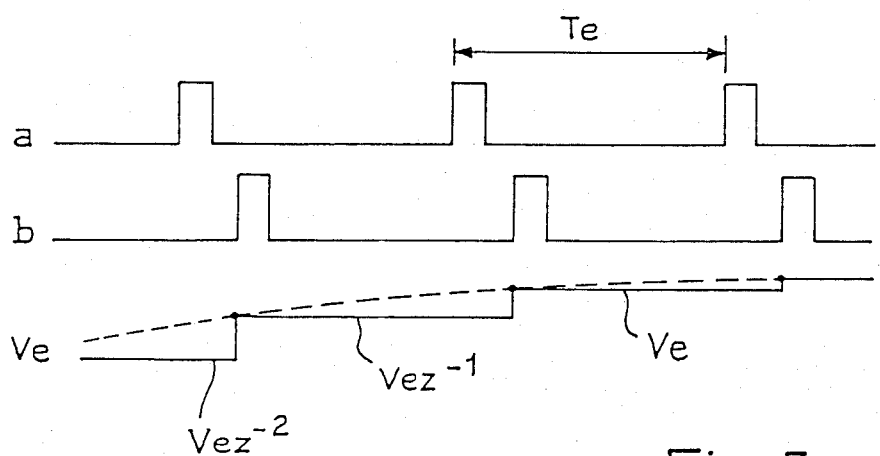
FIG. 5 shows a timing diagram of the closing phases of the switches.

The uneven rank switches I1, I3, I5, I7 are enabled for a first phase of each sampling period Te. The even rank switches are enabled during a second phase separate from the first one. The two phases are shown in FIG. 5, lines a and b respectively. The letters a and b close to the switches in FIG. 4 refer to the conduction phases of each switch as shown in FIG. 5. The third line of FIG. 5 shows how the voltage to be filtered (shown with a broken line) is sampled at the time of phase b, with a period equal to the operating period Te of the switches, and how it is inhibited at the sampled value at least until after the beginning of the first phase a of the first following period (in practice until the second phase of the next period).

To show what the transfer function of this filter is and how the offset voltages of the amplifiers are eliminated, we will reason from z transforms as is conventional for sampled systems.

Taking as time reference a given sampling period Te (shown in FIG. 5), and designating as Vs and Vs' the effective output voltages at the output of the amplifiers during this period, that is to say in practice Vs during the high level of phase b and V's during the high level of phase a, we will designate by $V_s z^{-1}$ and $V's z^{-1}$, in accordance with the Z notation, the effective output voltages of the amplifiers at the corresponding times of the period preceding the reference period.

Similarly, Ve, $Ve z^{-1}$ and $Ve z^{-2}$ will represent the input voltages at the reference period, at the preceding period and at the period which again precedes. But, since Ve is sampled and inhibited from the second phase, it can be seen that Ve changes in the middle of each period and that there is present simultaneously during phase a of the reference period an output voltage V's and an input voltage $Ve z^{-1}$, and simultaneously during phase b an output voltage Vs and an input voltage Ve.

If, finally, we call Voff and V'off the offset voltages at the input of amplifiers A1 and A2 respectively, these voltages being assumed to be practically invariable from one period to the next since it is a question of very slow drift voltages, the operation of the filter may be defined in the following way:

In phase b of the period preceding the reference period, the second amplifier A2 is looped with unitary gain by switch I2 and potentials $V_s z^{-1}$ and zero are applied respectively to capacitors C3 and C4 which are accordingly charged or discharged.

The reference potential connected to switch I8 is for example a zero potential to which are connected the non inverting inputs of the amplifiers.

Considering the offset voltage V'off present at the input of amplifier A2, the sum of the charges of capacitors C3 and C4 is $(V_s z^{-1} - V'\text{off})C3 - V'\text{off}C4$.

At the end of phase b switch I2 opens and this overall charge is trapped; switches I4, I6, I8 are also opened at the end of phase b but with a slight delay with respect to switch I2.

When phase a of the next period beings, switches I1, I3, I5, I7 are closed so that:

(1) the potential V's is applied simultaneously to C3 and C4; this a priori indeterminate potential is automatically adjusted as a function of the charge trapped on C3 and C4 so that the conservation of the charges is respected: V's must be such that:

$$(V's - V'\text{off})(C3 + C4) = (V_s z^{-1} - V'\text{off})C3 - V'\text{off}C4$$

or $$V's = V_s z^{-1} C3/(C3 + C4) \quad (1)$$

(2) V's is applied through switch I3 to C2 while the first amplifier A1 is looped with unitary gain by switch I1 and while $Ve z^{-1}$ is applied to C1; the result is that a charge $C1(Ve z^{-1} - V\text{off})$ appears on capacitor C1 and a charge $C2(V's - V\text{off})$ on capacitor C2.

The sum of these charges on C1 and C2 is trapped at the end of phase a, at the time of opening of switch I1. Switches I3, I5 and I7 are opened at the end of phase a, very slightly after switch I1.

The total trapped charge is $(Ve z^{-1} - V\text{off})C1 + (V's - V\text{off})C2$ In the next phase b, switches I2, I4, I6, I8 are closed so that the potential Vs is applied to capacitor C2. But the input voltage Ve changes at this time (sampling on the second phase) and passes from $Vez^{-1}$ to Ve.

The result is that the output voltage of amplifier A1 is automatically adjusted so as to respect the conservation of the trapped charges: Vs must take on a value such that:

$$(Vs-Voff)C2+(Ve-Voff)C1=(Vez^{-1}-Voff)C1+(V's-Voff)C2$$

or $$VsC2+VeC1=Vez^{-1}C1+V'sC2 \quad (2)$$

Actually, the voltages Voff and $Voffz^{-1}$ or V'off and $V'offz^{-1}$ should be considered but it is considered that $Voff=Voffz^{-1}$ and $V'off=V'offz^{-1}$ considering the very slow drift of these voltages with respect to the sampling rate.

Putting equations (1) and (2) together, we obtain a transfer function independent of the two offset voltages, which is:

$$\frac{Vs}{Ve} = -\frac{C1}{C2} \cdot \frac{z-1}{z-C3/(C3+C4)}$$

It is indeed of a z transfer function of a high-pass filter of the first order.

Of course, the voltage Vs must be "read" at the output of the filtering element during phase b.

One of the very important advantages of this particular filter structure, besides elimination of the effect of the offset voltages, is the possibility of obtaining precisely the desired cut-off frequency despite the manufacturing dispersion of the capacities in the integrated circuits. This cut-off frequency depends on the ratio C3/(C3+C4) and, in the applications where it is relatively low (telephony applications for example), the ratio C3/(C3+C4) is fairly close to 1.

Physically, it will be readily understood that the fact of applying first of all Vs to one capacitor then V's to a capacitor of different value involves directly the ratio of these two capacitors. But here Vs is applied first of all to capacitor C3 then V's to the same capacitor C3 plus a small capacitor C4. Only manufacturing dispersion comes as an inaccuracy into the corrective term C4/C3 which is small compared with unity.

The switches are preferably MOS transistors and it is particularly desirable for switches I1 and I2 to be MOS transistors with very low parasite capacity. The control circuit for these transistors is not shown.

Figure 6:
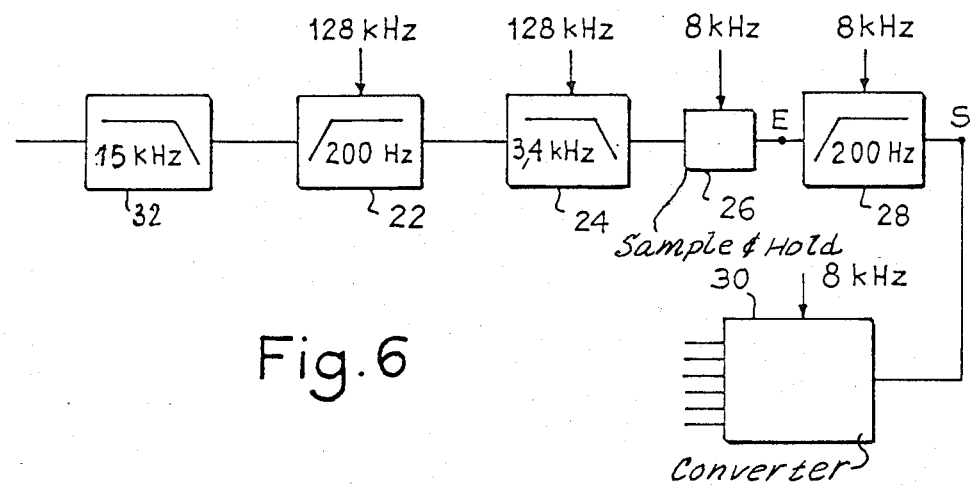
FIG. 6 shows a block diagram of a filter and analog-digital coder for implementing the invention.

To come back to the particularly interesting application of filtering and digital conversion of speech signals in telephony, the circuit structure is shown in FIG. 6 which it is proposed constructing by using the high-pass filtering element of the invention.

Filtering in the useful frequency band is effected for example by means of a switched capacity high-pass filter 22, of the second order, sampled at 128 kHz, having a cut-off frequency of about 200 Hz, followed by a switched capacity low-pass filter 24, of the fifth order, sampled at 128 kHz and having a cut-off frequency of about 3.4 kHz, then by a sampler-inhibitor 26 which operates at 8 kHz, then by a high-pass filter of the first order 28, without offset, in accordance with the invention, with a cut-off frequency of about 200 Hz, which operates at the same frequency (8 kHz) as the sampler-inhibitor 26 and whose switching phases are synchronized with those of the sampler-inhibitor in the way explained with reference to FIGS. 4 and 5. A so-called "anti withdrawal" filter 32, non sampled, is placed upstream of filter 22; this is a low-pass filter with a cut-off frequency of about 15 kHz (preferably a so-called Sallen and Key cell) which eliminates more especially the frequencies in the 124 kHz to 132 kHz band (centered on the sampling frequency).

The output of the high-pass filter 28 is connected to an analog-digital converter 30 which also operates in a sampled fashion, at the same frequency of 8 kHz as filter 28, to supply every 125 microseconds a binary number representing the amplitude of a signal sample applied to its input. The operation of the converter is synchronized with that of switches I1 to I8 of filter 28 so that the signal samples Vs applied to the converter for conversion are samples taken from the output S of filter 28 in phase b of the sampling period Te.

Converter 30 comprises at least one comparator for comparing the voltage Vs with reference values for defining a binary number representative of the level of Vs. According to one important feature of the invention, this comparator is incorporated in filter 28 and is formed essentially by the second amplifier A2 which operates periodically as a comparator outisde phases a and b. The voltage to be compared with reference values is defined by the charge trapped on capacitor C3 after the end of phase b.

This charge must be balanced by a suitable potential on capacitor C3 or on another capaicitor connected to the input of amplifier A2, or better still on a fraction of capacitor C3 if it is formed from several capacitors in parallel, so that the output of the amplifier remains at zero. An imbalance in one direction or in the other causes the output of amplifier A2 to switch which is in an open loop. The switching direction is used for defining a modification of the potentials or of the input capacitors to which these potentials are applied, so as to draw nearer a state of equilibrium by successive approximations.

A logic search circuit automatically effects this drawing nearer in each sampling period, after the end of the second phase b.

Figure 3:
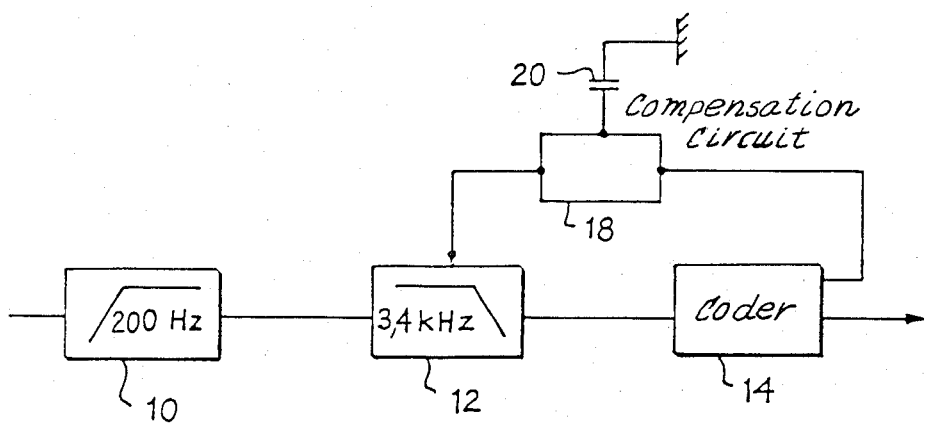

A particularly interesting implementation will be described, in which capacitor C3 is broken up into a plurality of parallel capacitors capable of being brought into use individually by respective switches, these capacitors, when they are effectively connected in parallel, play the role of capacitor C3 in the filter of FIG. 3; when they are taken individually, they allow as it were a variable potential to be established serving as reference for the converter during searching by successive approximations.

Figure 7:
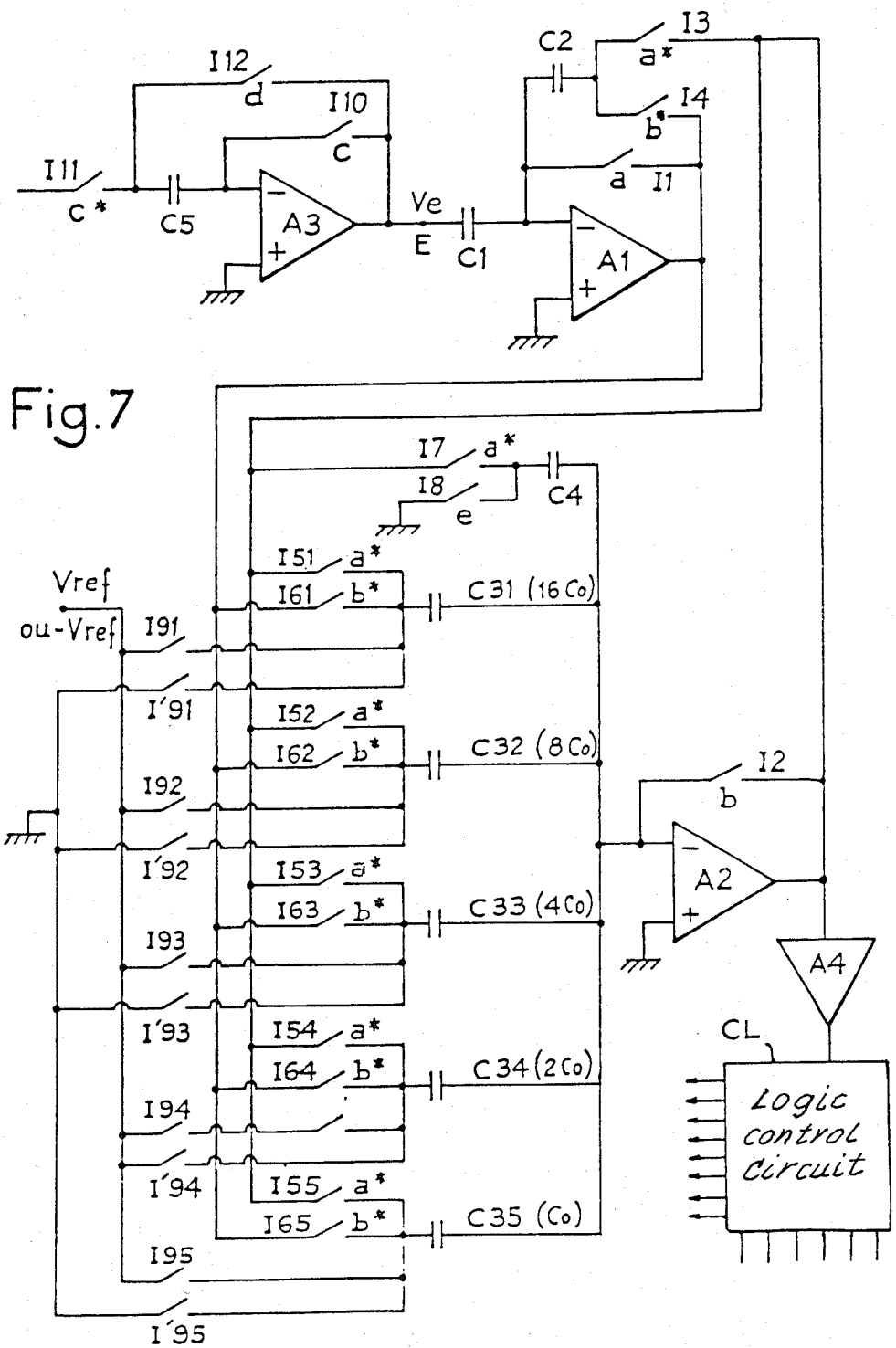
FIG. 7 shows the sampler-inhibitor, the high-pass filter and the converter of FIG. 6.

A diagram of this high-pass filter of the first order associated with an analog-digital converter and preceded by a sampler-inhibitor is shown in FIG. 7.

The sampler-inhibitor (at 8 kHz) comprises an operational amplifier A3 having a grounded non inverting input, an inverting input connected to a terminal of a capacitor C5 and an output connected both to the inverting input by a switch I10 and to the other terminal of capacitor C5 through a switch I12. This other terminal is connected by a switch I11 to a signal input which receives the signal to be sampled and inhibited (signal coming in fact from the low-pass filter 24 in the chain of FIG. 6).

Since the low-pass filter 24 is itself sampled, it should be noted that the conducting phase of switch I11 is synchronized with this sampling (128 kHz) so that the input voltage does not oscillate during closing of switch I11.

The output of the sampler-inhibitor, that is to say the output of amplifier A3, is connected to the input E of the first order high-pass filter which is here again formed by a two operational amplifier arrangement A1 and A2 corresponding to the diagram of FIG. 4, with this difference that capacitor C3 is replaced by several partial capacitors (C31, C32, C33, C34 and C35 in FIG. 7), and that switches I5 and I6 are each replaced by as many switches (I51, I52, I53, I54, I55 and I61, I62, I63, I64, I65) as there are partial capacitors.

Switches I51 to I55 are all controlled together (at the same time as switch I3); switches I61 to I65 are also all controlled together (at the same time as switch I4) so that operation of the circuit is the same as if there were a single capacitor C3 equal to the sum of the partial capacitors.

$$C3 = C31 + C32 + C33 + C34 + C35$$

Another difference with the diagram of FIG. 4, related to this breakdown of capacitor C3 into partial capacitors isolated from each other by their respective switches, is the fact that a reference potential or zero potential may be applied individually to each of the partial capacitors (or to several at the same time), by means of the respective switches I91 and I'91 for C31, I92 and I'92 for C32, I93 and I'93 for C33, I94 and I'94 for C34 and I95 and I'95 for C35. This potential may itself assume several values, for example a reference voltage Vref and the inverse thereof −Vref.

Finally, the filter associated with an analog-digital converter of FIG. 7 may comprise an additional amplifier A4 at the output of amplifier A2 for the case where this latter does not have sufficient gain for switching cleanly for the smallest voltage step to be detected.

The output of amplifier A4 (all or nothing output) is applied to a logic balance search circuit CL whose function is, as is moreover the case in any analog-digital converter, to effect, according to a pre-established search program, a comparison of the voltage to be converted successively with different digitally coded reference values, until the reference value is found which is the closest to the voltage to be converted, and whose function is to supply at its output a digital code corresponding to this value.

Here, use is made of the fact that at the end of phase b, the output voltage Vs of the filter (output S of amplifier A1) is stored in capacitor C3. If then the voltage at the terminals of C4 is maintained at zero (by leaving switch I8 closed) it can be seen that the charge stored on C3 is VsC3.

If a voltage V is then applied to one of the capacitors C31 to C35, for example capacitor C31, by applying a zero voltage to the others, the output of amplifier A2, which is in an open loop, will switch in one direction or the other depending on whether V is greater or smaller than VsC3/C31.

The partial capacitors C31 to C35 have weighted values, preferably in a geometrical progression with a common ratio of 2; for example C35=Co, C34=2Co, C33=4Co, C32=8Co, and C31=16Co.

The balance search for effecting the conversion is carried out in the following way (while switches I1, I2, I51 to I55 and I61 to I65 are open):

The logic circuit CL applies a zero voltage to all the partial capacitors at the same time (closing of switches I'91 to I'95). Depending on the switching direction of amplifier A2, the sign bit of the Vs conversion is determined. This sign bit determines, for the whole search program which follows, the sign of the reference voltage then applied to the partial capacitors (Vref or −Vref).

The following phase consists in applying Vref (for example) to C31 only by opening switch I'91 and closing switch I91. Depending on the switching direction of amplifier A2, the logic circuit CL opens switch I91 again or leaves it closed.

Then switch I'92 is opened and switch I92 is closed to apply Vref through C32. Depending on the switching direction of the amplifier, the logic circuit opens switch I92 again or leaves it closed and so on as far as the smallest capacitor C35, according to a successive approximation procedure.

The state of switches I91 to I95 or I'91 to I'95 then forms a binary digital code of the value of voltage Vs, this code being supplied by circuit CL which controls closure of the switches.

The procedure may moreover continue with a more accurate measurement phase by then applying for example successively different Vref values until a more accurate approximation of Vs is obtained.

Of course, this procedure is completely carried out during a sampling period Te (125 microseconds), the logic circuit CL operating at a considerably higher frequency so as to allow the whole search to be carried out during this period.

Figure 8:
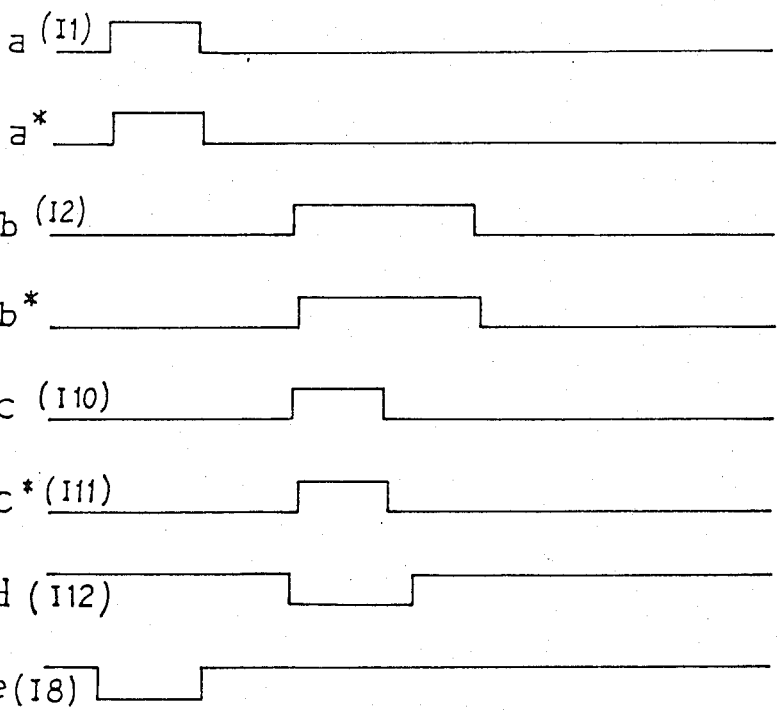
FIG. 8 shows a timing diagram of the control signals for closing the different switches of FIG. 7.

The closing phases of the different switches I1 to I11 of FIG. 7 will now be recalled, with reference to FIG. 8, except for switches I91 to I95 and I'91 to I'95 which are only actuated by the search logic circuit, so as to show how the analog-digital conversion phase may be carried out with the same amplifier A2 which serves for high-pass filtering, without disturbing the operation explained in connection with FIGS. 4 and 5. It should be noted that actuation of switches other than I91 to I95 and I'91 to I'95 is effected at the frequency of 8 kHz by the switching control circuit not shown, already mentioned in connection with FIGS. 4 and 5. The logic search circuit CL is synchronized with this switching control circuit so that the search is effected completely outside phase b of conduction of switch I1. The closing phase of switch I1 at the beginning of a sampling and conversion period of 125 microseconds is a square wave lasting 5 to 10 microseconds.

A slightly offset square wave, for example by means of two cascade inverters, forms a phase a*, the asterisk indicating the slight delay required between opening of switch I1 and opening of switches I3, I5 and I7. Here, switch I5 is replaced by switches I51 to I55, all controlled at the same time as I3 and I7 by the phase a*.

Figure 1:
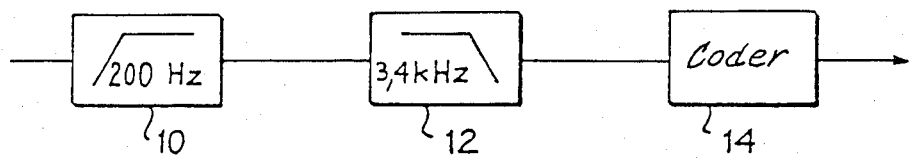
FIGS. 1 to 3, already described, show the general arrangement of a coder preceded by filters in the prior art.
Figure 2:
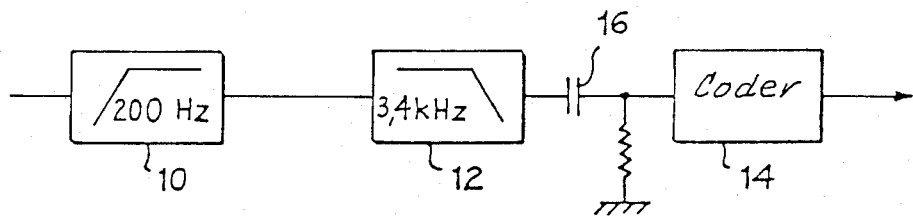

Switch I2 is closed during a phase b separate from phase a (and even from a*). Switches I4 and I61 to I65 are closed during a square wave b* which is slightly delayed with respect to the square wave of phase b. Switch I8, which as has been explained must be closed during phase b* for operation of the filter, is here closed not only for the duration of phase b* (for filtering) but for the whole of the time required for the analog-digital conversion phase. In fact, it is only open at the time of phases a and a*. A phase e of conduction of switch I8 has been shown in FIG. 1: it comprises a long square wave beginning after phase a* and finishing at the beginning of phase a of the following period.

Finally, the sampler-inhibitor is synchronized with phase b of the cycle in the following way: a phase c of conduction of switch I10 starts at the same time as phase b but is shorter. A phase c* of conduction of switch I11 corresponds to phase c but finishes slightly afterwards. A phase d of conduction of switch I12 begins after the end of phase c* but while phase b is still in progress (sampling during phase (b); it lasts until phase b of the next period (in any case until after phase (a) so that the inhibited sample is always present at input E at phase a of the following period.

What is claimed is:

1. A sampled filter including a high-pass filtering element of the first order comprising:
   first and second operational amplifiers each having an inverting input, a non-inverting input connected to a fixed potential, and an output,
   a filter input,
   a first capacitor coupling the filter input to the inverting input of the first amplifier,
   a filter output connected to the output of the first amplifier,
   a first switch connected between the inverting input and the output of said first amplifier,
   a second switch connected between the inverting input and the output of the second amplifier,
   a second capacitor having a first terminal coupled to the inverting input of said first amplifier and a second terminal,
   a third switch coupling said second terminal of said second capacitor to the output of said second amplifier,
   a fourth switch coupling said second terminal of said second capacitor to the output of said first amplifier,
   third and fourth capacitors, each having a first terminal coupled to the inverting input of said second amplifier,
   fifth and sixth switches respectively coupling the output of said second and first amplifier to said second terminal of said third capacitor,
   seventh and eighth switches respectively coupling the second terminal of said fourth capacitor to the ouput of said second amplifier and to a reference potential, and
   a switching control circuit for ensuring periodic conduction of the various switches according to two separate phases of each of a plurality of periods, the uneven numbered switches being closed during the first phase and the even numbered switches during the second phase.

2. The filter as claimed in claim 1, further comprising, upstream of the input of said high-pass filtering element of the first order, a sampler-inhibitor operating at the same frequency as that of the sampling of the filter and applying voltage samples taken at the time of the second phase of a first period and inhibited at least until the end of the first phase of a second period following said first period.

3. A filtering and analog-digital conversion assembly, comprising:
   a high-pass filtering element of the first order including: a sampled filter including a high-pass filtering element of the first order comprising: first and second operational amplifiers each having an inverting input, a non-inverting input connected to a fixed potential, and an output, a filter input, a first capacitor coupling the filter input to the inverting input of the first amplifier, a filter output connected to the output of the first amplifier, a first switch connected between the inverting input and the output of said first amplifier, a second switch connected between the inverting input and the output of the second amplifier, a second capacitor having a first terminal coupled to the inverting input of said first amplifier and a second terminal, a third switch coupling said second terminal of said second capacitor to the output of said second amplifier, a fourth switch coupling said second terminal of said second capacitor to the output of said first amplifier, third and fourth capacitors, each having a first terminal coupled to the inverting input of said second amplifier, fifth and sixth switches respectively coupling the output of said second and first amplifier to said second terminal of said third capacitor, seventh and eighth switches respectively coupling the second terminal of said fourth capacitor to the output of said second amplifier and to a reference potential, and a switching control circuit for ensuring periodic conduction of the various switches according to two separate phases of each of a plurality of periods, the uneven numbered switches being closed during the first phase and the even numbered switches during the second phase; and
   a converter, downstream of said high pass filtering element, said converter comprising a comparator in the form of an amplifier, this amplifier being said second amplifier used outside the first and second phases at a time when said second switch is open.

4. An assembly as claimed in claim 3, wherein said converter comprises a logic balance search circuit adapted to apply to the input of said second amplifier, through capacitors, potentials chosen as a function of the switching direction of the output of the comparator.

5. An assembly as claimed in claim 4, wherein said third capacitor includes a plurality of capacitor elements each connected at one side thereof to the inverting input of the second amplifier and capable of being connected individually by respective switches at different times to either ground or to a reference analog-digital conversion potential, or else to the output of said first amplifier or again to the output of said second amplifier under the control of the switching control circuit and the balance search circuit.

6. An assembly as claimed in claim 5, wherein said capacitor elements have respective values chosen according to a geometrical progression of ratio 2.

* * * * *